(12) United States Patent
Tsai et al.

(10) Patent No.: US 8,743,517 B2
(45) Date of Patent: Jun. 3, 2014

(54) ESD PROTECTION CIRCUIT

(75) Inventors: Fu-Yi Tsai, Hsinchu (TW); Yan-Hua Peng, Hsinchu (TW); Chia-Ku Tsai, New Taipei (TW); Ming-Dou Ker, Hsinchu (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/529,075

(22) Filed: Jun. 21, 2012

(65) Prior Publication Data

US 2013/0044397 A1    Feb. 21, 2013

(30) Foreign Application Priority Data

Aug. 15, 2011   (TW) .............................. 100129128 A (51) Int. Cl.
*H02H 3/22* (2006.01)
(52) U.S. Cl.
USPC ............................................ 361/56; 361/111
(58) Field of Classification Search
USPC .................................................. 361/56, 111
See application file for complete search history.

(56) References Cited

U.S. PATENT DOCUMENTS

| 5,530,612 | A |   | 6/1996 | Maloney |
| 5,610,790 | A | * | 3/1997 | Staab et al. ...................... 361/56 |
| 5,672,896 | A | * | 9/1997 | Lee et al. ........................ 257/360 |
| 5,744,841 | A | * | 4/1998 | Gilbert et al. .................. 257/360 |
| 7,317,603 | B2 | * | 1/2008 | Fischer et al. ................... 361/56 |
| 2002/0130390 | A1 | * | 9/2002 | Ker et al. ....................... 257/546 |

FOREIGN PATENT DOCUMENTS

| TW | 333693 | 1/1997 |
| TW | 475250 | 2/2002 |

OTHER PUBLICATIONS

Eugene R. Worley et, al., "CDM Effect on a 65nm SOC LNA", 2010, EOS/ESD Symposium 10-381.
Taiwan Intellectual Property Office, "Office Action", Dec. 23, 2013.

* cited by examiner

*Primary Examiner* — Danny Nguyen
(74) *Attorney, Agent, or Firm* — Winston Hsu; Scott Margo (57) ABSTRACT

ESD protection circuit including a resistor and at least one protection transistor; the resistor coupled between an I/O signal node and an internal node of internal circuit, the protection transistors serially coupled between the internal node and a voltage node with each protection transistor comprising a gate and a drain which is coupled to the gate.

8 Claims, 9 Drawing Sheets

ESD PROTECTION CIRCUIT

This application claims the benefit of Taiwan Patent Application No. 100129128, filed Aug. 15, 2011, the subject matter of which is incorporated herein by reference.

FIELD OF THE INVENTION

The present invention relates to an electro-static discharge (ESD) protection circuit, and more particularly, to an ESD protection circuit based on a topology of series metal-oxide-semiconductor (MOS) transistors.

BACKGROUND OF THE INVENTION

Dice (chips of integrated circuits) form the most important foundation of modern information society. To drain operation power, dice include supply pads, such as power pads and ground pads respectively conducting power voltages and ground voltages to power routings and ground routings (both generally referred to as supply routings) inside the dice. To exchange signals with external circuitry, dice further include Input/output (I/O) pads conducting I/O signals to signal routings inside the dice, such that internal circuitry of the dice can exchange signals via the signal routings. A die can also be divided to different power domains; internal circuitry of different power domain operates in different supply voltage and/or ground voltage. However, ESD of high voltage also conducts to interior of a die via its pads and routings; to protect a die against ESD damage, a die is equipped with ESD protection circuits.

Figure 1A:
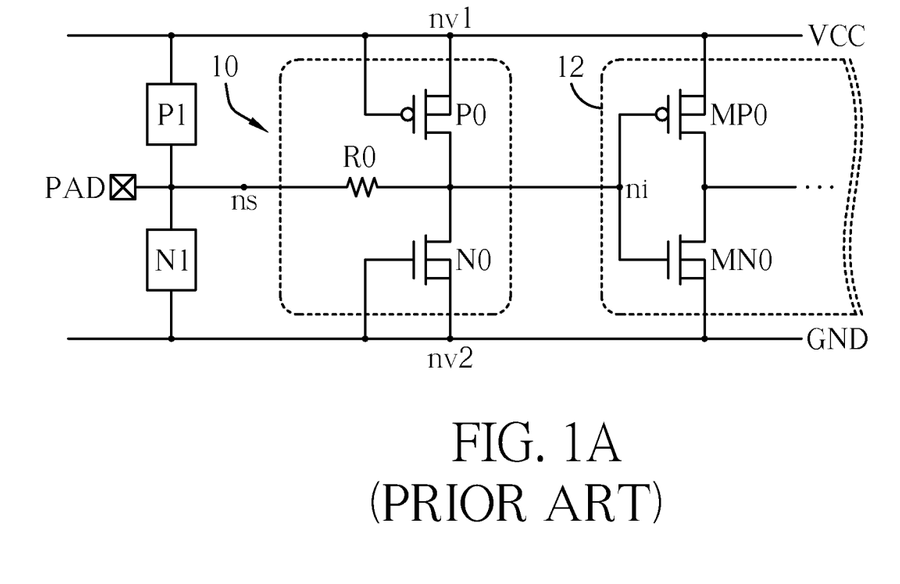
FIG. 1A (prior art) illustrates a prior art ESD protection circuit.

When an ESD event zaps between a signal routing and a supply routing, the ESD protection conducts ESD current between the two routings, so the ESD current does not accumulate to cause high voltage which damages internal circuitry coupled to the signal routing. Please refer to FIG. 1A illustrating a prior art ESD protection circuit 10, which is applied to an input pad PAD for protecting an internal circuit 12; for example, the internal circuit 12 includes a p-channel MOS transistors MP0 and an n-channel MOS transistor MN0, and gates of them are commonly coupled to a node ni for receiving signal via signal routing of a node ns. The internal circuit 12 is respectively coupled to direct-current (DC) voltages VCC (a power voltage) and GND (a ground voltage) via supply routings of nodes nv1 and nv2. In the internal circuit 12, gate-oxide tolerable voltage of the transistors MP0 and MN0 is denoted by a voltage Vt_ox; for dice of modern advanced manufacturing process, internal circuitry is formed by transistors of thin gate-oxide, thus the tolerable voltage Vt_ox is quite low. That is, when a voltage at the node ni is greater than the voltage Vt_ox, gate-oxide of the transistor(s) MP0 and/or MN0 will be damaged.

To protect gate-oxide of the transistors MN0 and MP0, the prior art ESD protection circuit 10 includes a primary ESD protection element N1, a primary ESD protection element P1 and a secondary protection circuit formed by a resistor R0 and two transistors N0 and P0. The primary ESD protection element N1 is coupled between the nodes ns and nv2, and the primary ESD protection element P1 is coupled between the nodes nv1 and ns. The transistors N0 and P0 are respectively n-channel and p-channel MOS transistors; a gate and a source of the transistor N0 are commonly coupled to the node nv2, and a drain of the transistor N0 is coupled to the node ni; a gate and a source of the transistor P0 are commonly coupled to the node nv1, and a drain of the transistor P0 is coupled to the node ni.

Operation of the ESD protection circuit 10 is described as follows. When ESD does not occur, the primary ESD protection elements N1 and P1, as well as the transistors N0 and P0, do not conduct. When ESD occurs between the nodes ns and nv2, a rapidly rising voltage V_ESD will be built at the node ns if the primary ESD protection element N1 does not conduct first or excessive ESD current flows through the primary ESD protection element N1 despite that the primary ESD protection element N1 has conducted first; consequently, the node ni is conducted to the node nv2 by breakdown conduction of the transistor N0 if the voltage V_ESD is positive (with respect to the node nv2) or by conduction of a forward-biased parasitic diode of the transistor N0 if the voltage V_ESD is negative. Therefore, a voltage Vg at the node ni can be calculated by:
$Vg=Vbd\_mos+(V\_ESD-Vbd\_mos)*Rmos/(R0+Rmos)$;
where the voltage Vbd_mos is a voltage across the node ni and nv2 when the transistor N0 conducts, the resistor Rmos is an equivalent resistance between the nodes ni and nv2 when the transistor N0 conducts by breakdown.

To protect the gates of the transistors MP0 and MN0, the ESD protection circuit 10 needs to keep the voltage Vg of the node ni lower than the gate-oxide tolerable voltage Vt_ox. In other words, designers of the prior art ESD protection circuit 10 should design dimensions of the transistor N0 according to circuit model of transistor breakdown, and thus derive resistance of the resistor R0. However, while simulating behavior of MOS transistor by circuit simulation software (e.g., SPICE), circuit model for simulating channel conduction (the conduction via carrier channel between drain and source formed by inversion layer under gate-oxide) is more accurate, and circuit model for simulating breakdown conduction is less accurate; therefore, it is difficult to correctly consider operation of breakdown conduction, design and implementation of the prior art ESD protection circuit 10 are consequently impacted.

Furthermore, other design and application issues exist for the prior art ESD protection circuit 10. If the transistors MN0/MP0 are transistors of thin gate-oxide, the transistors N0/P0 should be implemented also by transistors of thin gate-oxide to obtain better protection, but leakage current will therefore be larger, and equivalent capacitance also becomes higher to increase loading at the node ni and compromise high speed signal transmission. If the transistors N0/P0 are of thick gate-oxide, breakdown voltage for transistor breakdown conduction is greater, the transistors are thus more difficult to turn on timely and rapidly, and operation of ESD protection is hence degraded.

Figure 1B:
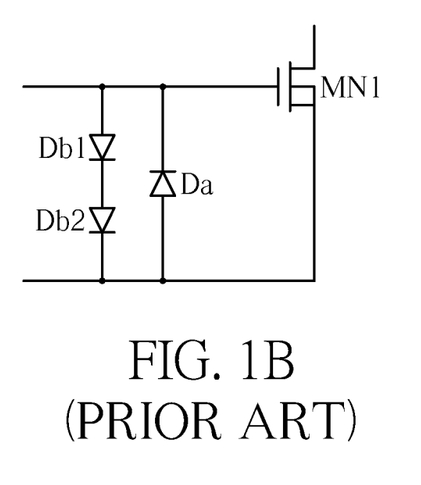
FIG. 1B (prior art) illustrates another prior art ESD protection circuit.

On the other hand, an ESD protection circuit formed by series diodes, as shown in FIG. 1B, is mentioned in "CDM Effect on a 65 nm SOC LNA", p. 381, EOS/ESD Symp., 2010 by Worley et al. and U.S. Pat. No. 5,530,612; it protects gate of a transistor MN1 by diodes Da, Db1 and Db2. Nevertheless, this prior art ESD protection circuit also suffers pitfalls. A diode forms cathode and anode respectively by an n-well and a p-doped region in the n-well; as multiple diodes (e.g., the diodes Db1 and Db2) have to be serially coupled, there will be multiple n-wells. Since every two n-wells must be separated by a considerable distance and each n-well must be enclosed by a guard ring, the prior art ESD protection circuit suffers from larger layout area and lower area usage efficiency. In addition, p-doped region, n-well and p-substrate of ground voltage form a pnp leakage path of Darlington pair toward ground, thus more leakage current is conducted. Furthermore, in the prior art ESD protection circuit, while anodes and cathodes of the series diodes are coupled between a first node and a second node, an additional diode of opposite direction (e.g., the diode Da) must also be included; the diode of opposite direction has its anode and cathode respectively coupled to the second node and the first node for conducting ESD current from the second node to the first node. This diode of opposite direction occupies additional layout area.

SUMMARY OF THE INVENTION

An objective of the invention is providing an ESD protection circuit including a resistor and at least a protection transistor; each protection transistor is serially coupled between an internal node and a voltage node; each protection transistor has a gate, a source and a drain with the gate coupled to the drain. The resistor is coupled between the internal node and a signal node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2:
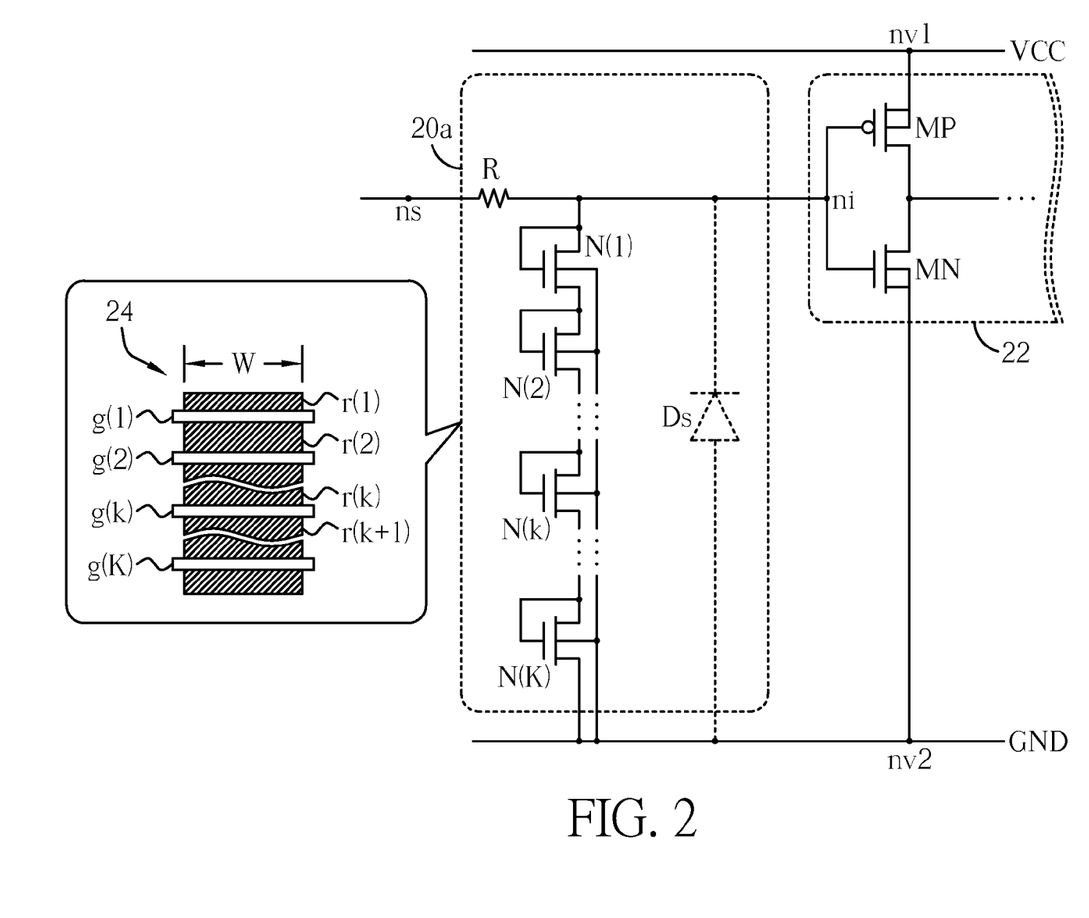
FIG. 2 to FIG. 10 illustrate ESD protection circuits according to embodiments of the invention.

Please refer to FIG. 2 illustrating an ESD protection circuit 20a according to an embodiment of the invention; it can be implemented in a die to protect an internal circuit 22 of the die. For example, the internal circuit 22 includes two transistors MP (a p-channel MOS transistor) and MN (an n-channel MOS transistor), gates of them are commonly coupled to a node ni (an internal node) for receiving signal from signal routings of a node ns (a signal node). The signal can come from an input pad, or be a signal outputted to the node ns from another power domain. The internal circuit 22 are coupled to voltages VCC (power voltage) and GND (ground voltage) respectively by supply routings of nodes nv1 and nv2 (two voltage nodes); a source and a bulk of the transistor MN is coupled to the node nv2, a source and a bulk of the transistor MP is coupled to the node nv1. The transistors MN and MP can be transistors of thin gate-oxide, which occupy less area, respond faster and operate under low power voltage; tolerable gate-oxide voltage of these two transistors is denoted by a voltage Vox_t.

In the embodiment of FIG. 2, the ESD protection circuit 20a of the invention includes a resistor R and transistors N(1), N(2), . . . , N(k) to N(K). The transistor R is coupled between the nodes ns and ni, and the transistors N(1) to N(K) function as protection transistors and are serially coupled between the nodes ni and nv2; where the quantity K is a constant integer, each transistor N(k) (for k=1 to K) can be an n-channel MOS transistor having a gate, a source, a drain and a bulk with the gate coupled to the drain, the drain and the source coupled between the nodes ni and nv2, and the bulk coupled to the node nv2. If the quantity K equals 1, the drain and the source of the transistor N(1) are respectively coupled to the nodes ni and nv2. If the quantity K is greater than 1, the drain of the first transistor N(1) among the transistors N(1) to N(K) is coupled to the node ni, and the source of the last transistor N(K) is coupled to the node nv2; the drain of the transistor N(k) (for k larger than 1 and smaller than or equal to K) is coupled to the source of the preceding transistor N(k−1).

In an embodiment of the invention, the transistors N(1) to N(K) can be transistors of thick gate-oxide. For example, in a die, transistors of thin gate-oxide and low power voltage are adopted to form internal core circuit of the die, and transistors of thick gate-oxide and high power voltage are used to form input/output circuit of the die; the transistors N(1) to N(K) can then be implemented by the latter. That is, gate-oxide thickness of the transistors N(1) to N(K) can be greater than or equal to that of the internal transistors MP and MN. Transistors of thick gate-oxide benefit from less leakage current and lower parasitic capacitance.

When ESD does not happen and the die operates normally, voltage at the node ni is lower than superposition of the threshold voltages of the transistors N(1) to N(K), thus the transistors N(1) to N(K) are not turned on for conduction, and normal operation of the die is therefore not affected. When ESD occurs between the nodes ns and nv2 to cause a positive voltage V_ESD at the node ns, the voltage V_ESD is greater than superposition of the threshold voltages of the transistors N(1) to N(K), so the transistors N(1) to N(K) are turned on with channel conduction, and ESD current is hence conducted from the nodes ni to nv2. Under such circumstance, a voltage Vg at the node ni is calculated as: Vg=V_ESD−I*R, where the current I is a drain-to-source channel current conducted between the nodes ni and nv2 by the transistors N(1) to N(K). That is, with proper designed resistor R, the current I conducted by the transistors N(1) to N(K) lowers impact of the voltage V_ESD, such that the voltage Vg at the node ni is less than the voltage Vox_t to protect gate-oxide of the internal circuit 22.

Comparing to the prior arts, advantages of the ESD protection circuit 20a of the invention can be described as follows. The ESD protection circuit performs ESD protection based on channel conduction, i.e., the ESD protection of the invention takes advantages of the characteristics when MOS transistors operate in active region, thus the current I is conducted via drain-to-source channel in the inversion layer formed under gate as gate-to-source cross voltage is greater than threshold voltage. Therefore, while designing ESD protection circuit according to the invention, designers can correctly expect operation of ESD protection according to channel conduction circuit model of higher accuracy.

Because ESD protection of the invention is based on channel conduction related to threshold voltage, and threshold voltage of MOS transistor is lower than breakdown voltage, ESD protection of the invention responds to ESD more rapidly and timely than breakdown conduction does. Also, the invention is more flexible in application, since the quantity K of the transistors N(1) to N(K) can be used to adjust a trigger voltage for turning on the ESD protection circuit 20a. For a less quantity K, superposition of the threshold voltages of the transistors N(1) to N(K) is lower, and hence the ESD protection circuit 20a can be triggered to conduct more easily for more sensitive response to ESD events.

The transistors N(1) to N(K) of the ESD protection circuit 20a are arranged in a series topology, thus parasitic capacitance of the transistors is reduced due to series connection, loading at the node ni is decreased, and the ESD protection circuit of the invention can be adopted to provide ESD protection for signal routings where high speed signals transmit.

Furthermore, layout area usage efficiency of the invention is higher, because layouts of the transistors N(1) to N(K) can be connected together. FIG. 2 also illustrates a layout embodiment 24 of the transistors N(1) to N(K); in the layout embodiment 24, each of gate-oxide regions g(1), g(2), ..., g(k) to g(K) forms the gate of each of the transistors N(1), N(2), ..., N(k) to N(K), other doped regions (e.g., n-doped region) r(1), r(2) to r(k), r(k+1) etc. are drains and sources of the transistors. For example, the region r(2) is the source of the transistor N(1), also is the drain of the transistor N(2); similarly, the region r(k) is the drain of the transistor N(k), also the source of the transistor N(k−1). That is, the transistors N(1) to N(K) do not need separations in-between; they are arranged closely to reduce overall layout area. Besides, the transistors N(1) to N(K) do not form leakage paths of Darlington pair.

In the embodiment of FIG. 2, because the bulks of the transistors N(1) to N(K) are commonly coupled to the node nv2, the transistors N(1) to N(K) form a parasitic diode Ds between the nodes ni and nv2; an anode and a cathode of the diode Ds are respectively coupled to the nodes nv2 and ni. Therefore, the ESD protection circuit 20a does not have to include an additional diode of opposite direction. When ESD hits between the nodes nv2 and ns with a positive voltage at the node nv2, the parasitic diode Ds performs ESD protection of the diode of opposite direction, such that ESD current of the node nv2 is conducted to the nodes ni and ns.

The ESD protection circuit 20a of the invention also provides various design parameters, so a same topology can be applied to different applications with different parameter settings. For example, the quantity K of the transistors N(1) to N(K) is a design parameter providing flexibility. In different applications, signal swing at the node ni is different, and signal DC offset is different; to adapt operation range of normal signaling, a minimal quantity K which keeps leakage current of the ESD protection circuit 20a below an allowable bound can be selected according to the invention, thus lower ESD trigger voltage and better ESD protection can be achieved without compromise of normal circuit operation.

Other design parameters of the ESD protection circuit of the invention include resistance of the resistor R and dimensions of the transistors N(1) to N(K), e.g., width W of the transistors, hence demands of input impedance and capacitive loading can be satisfied without compromise of ESD protection ability. In an embodiment of the invention, the ESD protection circuit 20a can function as a secondary protection circuit to cooperate with a primary protection circuit (not shown) for ESD protection. The primary protection circuit can be coupled between the nodes nv1, nv2 and/or ns; for example, if the primary protection circuit is farther away from the protected node ns, when ESD occurs between the nodes ns and nv2 with a positive voltage at the node ns, the primary protection circuit and equivalent capacitance-resistance coupled to it clamp the voltage at the node ns, such that the voltage at the node ns is not greater than a voltage V_ESDmax; the ESD protection circuit 20a conduct the current I, thus voltage at the node ni does not exceed the gate tolerable voltage Vox_t of the internal circuit. That is, when the primary and secondary protection circuits function, following equation is satisfied: V_ESDmax=I*R+Vox_t. According to the equation, a design flow of ESD protection can be established, and the various design parameters of the invention can be utilized to adapt different ESD protection demands of different applications.

In the design flow, test circuit is first adopted to verify the voltage Vox_t which is tolerable by gate-oxide of a given process during ESD. Then, the voltage V_ESDmax, the current I and the resistor R can be adjusted according to the equation V_ESDmax=I*R+Vox_t, so as to adapt different applications. For example, the voltage V_ESDmax can be derived for known voltage Vox_t, current I and resistor R, hence voltage clamping ability of the primary protection circuit can be designed accordingly. Or, if the voltage V_ESDmax is already determined, the current I and the resistor R can be set according to demands of application. For example, in some applications, signal transmission requirement for the nodes ns and ni constrains the resistance of the resistor R, so resistance of the resistor R can not be too large; to adapt such constraint, the width W of the transistors N(1) to N(K) can be expanded. Expanded width W increases the current I conducted during ESD, so the voltage drop I*R is still sufficient to keep the voltage at the node ni below the voltage Vox_t. In some other applications, the width W is constrained, so the resistance of the resistor R can be increased, hence the voltage at the node ni can be suppressed below the voltage Vox_t by the ESD protection circuit 20a of the invention.

Figure 3:
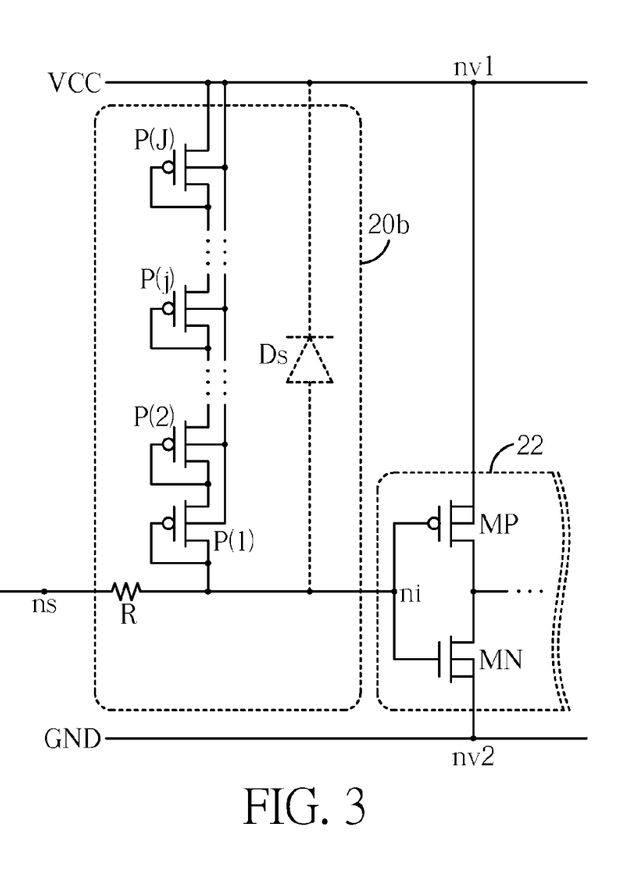
Figure 4:
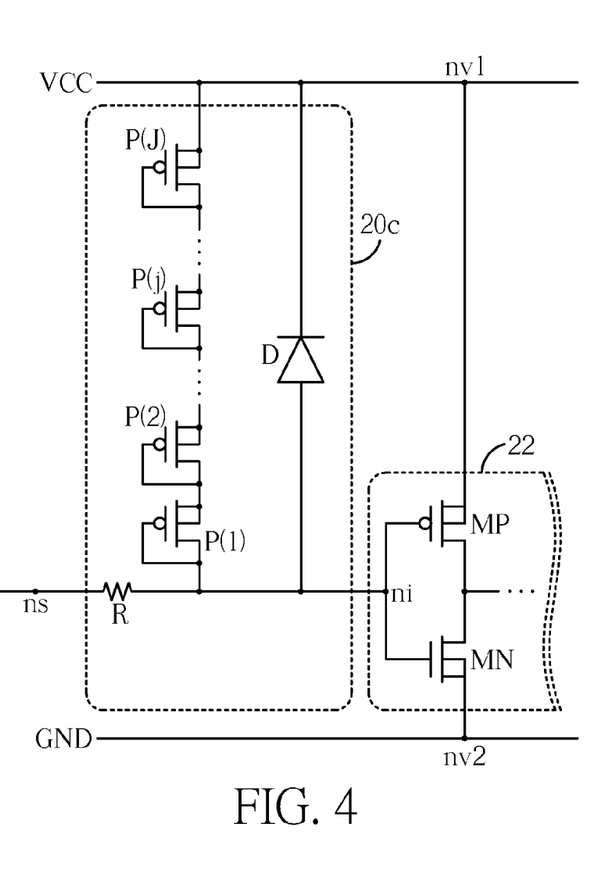

Please refer to FIG. 3 and FIG. 4 respectively illustrating ESD protection circuits 20b and 20c for protecting an internal circuit 22 according to embodiments of the invention. The internal circuit 22 receives signal from signal routing of a node ns, and is coupled to DC voltages VCC and GND via supply routings of nodes nv1 and nv2. The ESD protection circuits 20b and 20c both include a resistor R and transistors P(1), P(2), ..., P(j) to P(J). The resistor R is coupled between nodes ns and ni, the transistors P(1) to P(J) function as protection transistors, which are serially coupled between the nodes ni and nv1; wherein the quantity J is a constant integer. Each transistor P(j) (for j=1 to J) can be a p-channel MOS transistor including a gate, a source, a drain and a bulk; the gate is coupled to the drain, the source and the drain are respectively coupled between the nodes nv1 and ni. If the quantity J is greater than 1, the drain of the first transistor P(1) among the transistors P(1) to P(J) is coupled to the node ni, the source of the last transistor P(J) is coupled to the node nv1; the drain of the transistor P(j) (for j greater than 1 and less than or equal to J) is coupled to the source of the preceding transistor P(j−1). If the quantity J equals 1, the drain and the source of the transistor P(1) are respectively coupled to the nodes ni and nv1.

Operation of the ESD protection circuits 20b and 20c can be described as follows. When ESD attacks between the nodes nv1 and ns with a positive voltage V_ESD at the node nv1, because the voltage V_ESD is higher than superposition of the threshold voltages of the transistors P(1) to P(J), the transistors P(1) to P(J) turn on to conduct ESD current from the node nv1 to the nodes ni and ns, the voltage at the node ni is hence constrained, and gate-oxide of the internal circuit 22 is protected.

When ESD does not occur and the die operates normally, each of the transistors P(1) to P(J) does not conduct, thus normal operation of the die is not affected.

In the ESD protection circuit 20b of FIG. 3, the bulks of the transistors P(1) to P(J) are commonly coupled to the node nv1, a parasitic diode Ds is therefore formed between the nodes ni and nv1 with its anode and cathode respectively coupled to the nodes ni and nv1. When ESD hits between the nodes ns and nv1 with a positive voltage at the node ns, the parasitic diode Ds performs ESD protection of a forward-biased diode, such that ESD current of the node ns can be conducted to the node nv1. In the ESD protection circuit 20c of FIG. 4, each of the transistors P(1) to P(J) has its bulk individually coupled to its source, so the ESD protection circuit 20 can further include a diode D with an anode and a cathode respectively coupled to the nodes ni and nv1. When ESD strikes between the nodes ns and nv1 with a positive voltage at the node ns, parasitic diode formed by the transistors P(1) to P(J) and the diode D perform ESD protection of forward-biased diode, hence ESD current at the node ns can be conducted to the node nv1.

Figure 5:
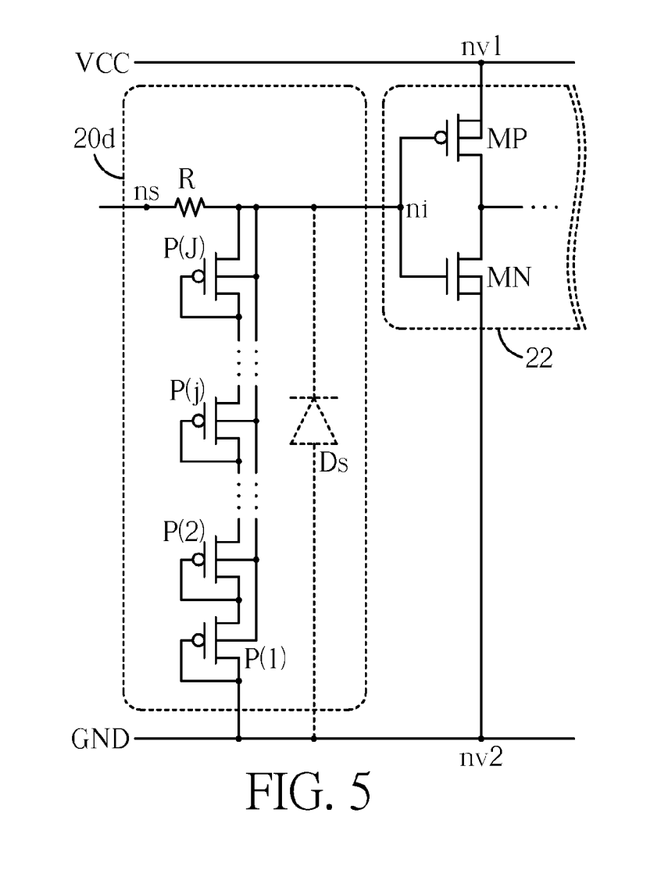
Figure 6:
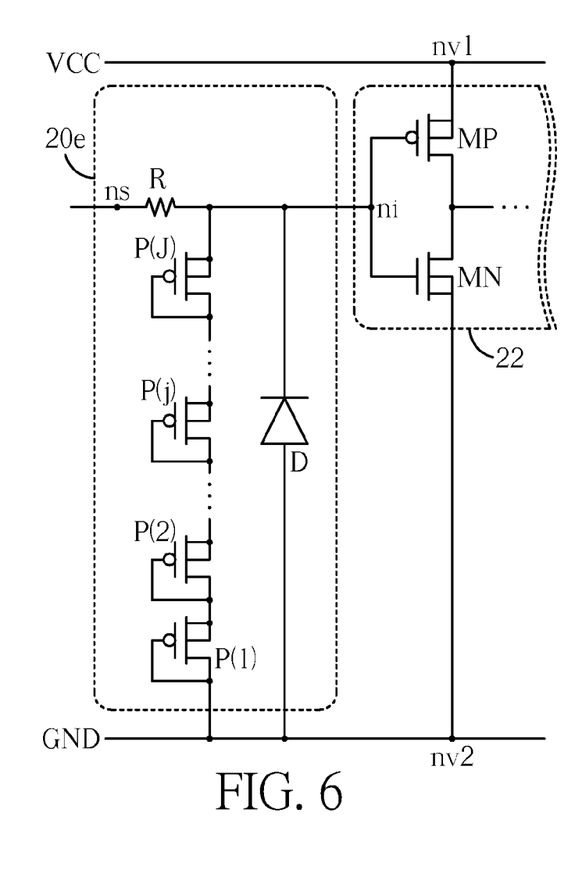
Figure 7:
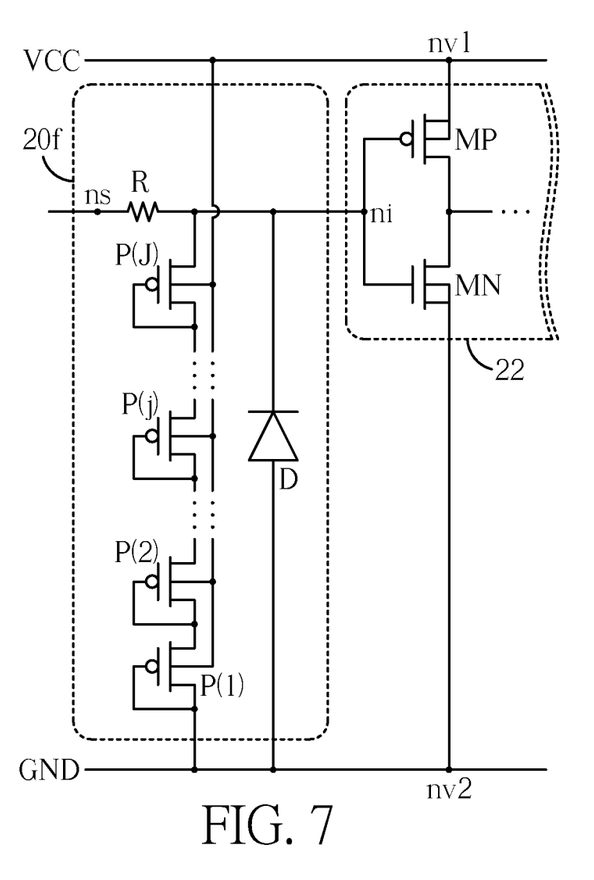

Please refer to FIG. 5 to FIG. 7 respectively illustrating ESD protection circuits 20d to 20f for protecting an internal circuit 22 according to embodiments of the invention. The internal circuit 22 receives signal from signal routing of a node ns, and is coupled to DC voltages VCC and GND via supply routings of nodes nv1 and nv2. The ESD protection circuits 20d, 20e and 20f all include a resistor R and transistors P(1), P(2), . . . , P(j) to P(J). The resistor R is coupled between nodes ns and ni, the transistors P(1) to P(J) function as protection transistors, which are serially coupled between the nodes ni and nv2; wherein the quantity J is a constant integer. Each transistor P(j) (for j=1 to J) can be a p-channel MOS transistor including a gate, a source, a drain and a bulk; the gate is coupled to the drain, the drain and the source are respectively coupled between the nodes nv2 and ni. If the quantity J is greater than 1, the drain of the first transistor P(1) among the transistors P(1) to P(J) is coupled to the node nv2, the source of the last transistor p(J) is coupled to the node ni; the drain of the transistor P(j) (for j greater than 1 and less than or equal to J) is coupled to the source of the preceding transistor P(j−1). If the quantity J equals 1, the drain and the source of the transistor P(1) are respectively coupled to the nodes nv2 and ni.

Similar to the ESD protection circuit 20a shown in FIG. 2, when ESD occurs between the nodes ns and nv2 with a positive voltage at the node ns, the transistors P(1) to P(J) of the ESD protection circuits 20d, 20e and 20f conduct ESD current from the nodes ni to nv2, and hence suppress the voltage at the node ni to protect gate-oxide of the internal circuit 22.

In the ESD protection circuit 20d of FIG. 5, the bulks of the transistors P(1) to P(J) are commonly coupled to the node ni, a parasitic diode Ds is therefore formed between the nodes ni and nv2 with its anode and cathode respectively coupled to the nodes nv2 and ni. In the ESD protection circuit 20e of FIG. 6, each of the transistors P(1) to P(j) has its own bulk individually coupled to its source, thus the ESD protection circuit 20e can include a diode D having an anode and a cathode respectively coupled to the nodes nv2 and ni. In the ESD protection circuit 20f of FIG. 7, the bulks of the transistors P(1) to P(J) are commonly coupled to the node nv1, and the ESD protection circuit 20f can include a diode D with an anode and a cathode respectively coupled to the nodes nv2 and ni. When ESD hits between the nodes nv2 and ns with a positive voltage at the node nv2, the diode Ds of the ESD protection circuit 20d and the diode D of the ESD protection circuits 20e and 20f perform ESD protection of a forward-biased diode, such that ESD current of the node nv2 can be conducted to the node ni.

Figure 8:
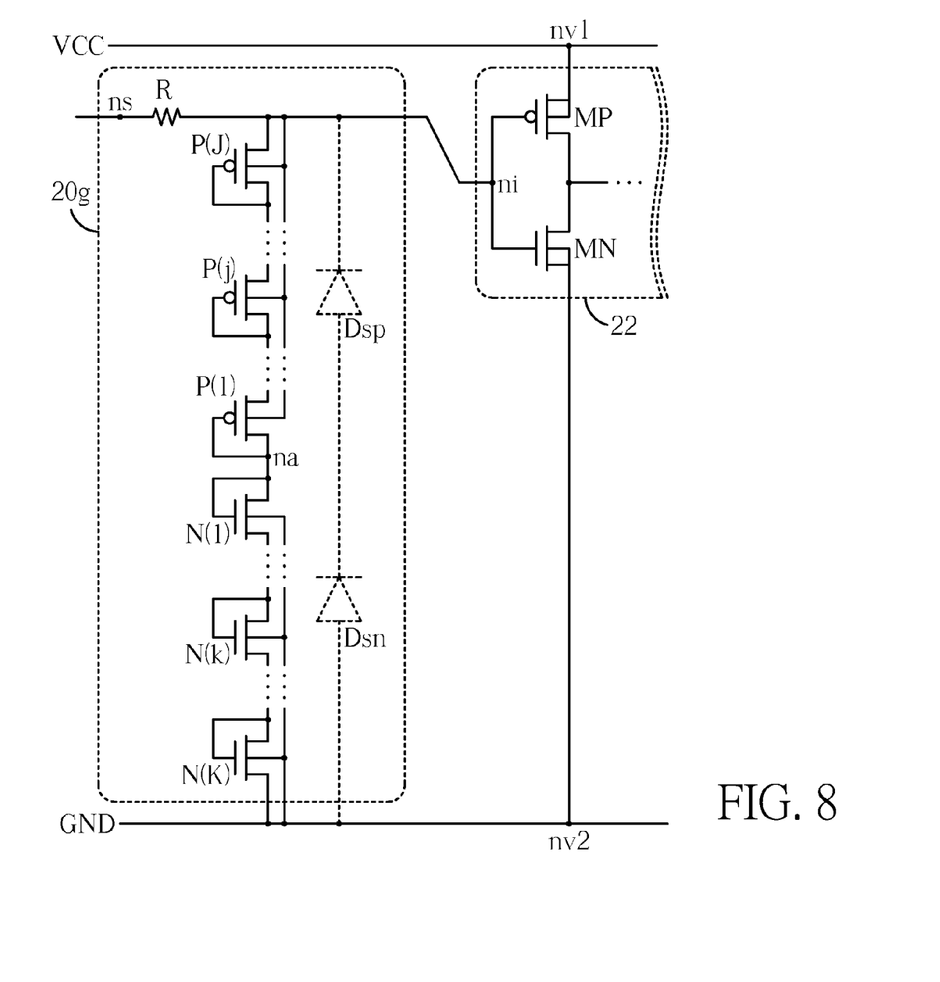
Figure 9:
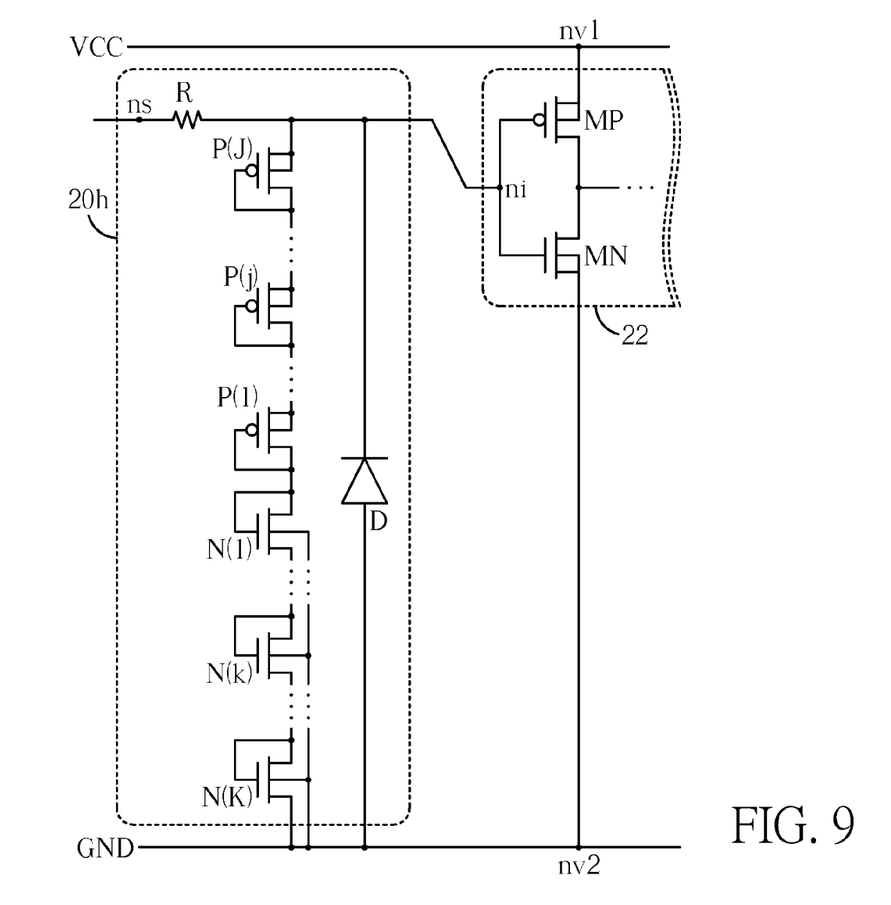
Figure 10:
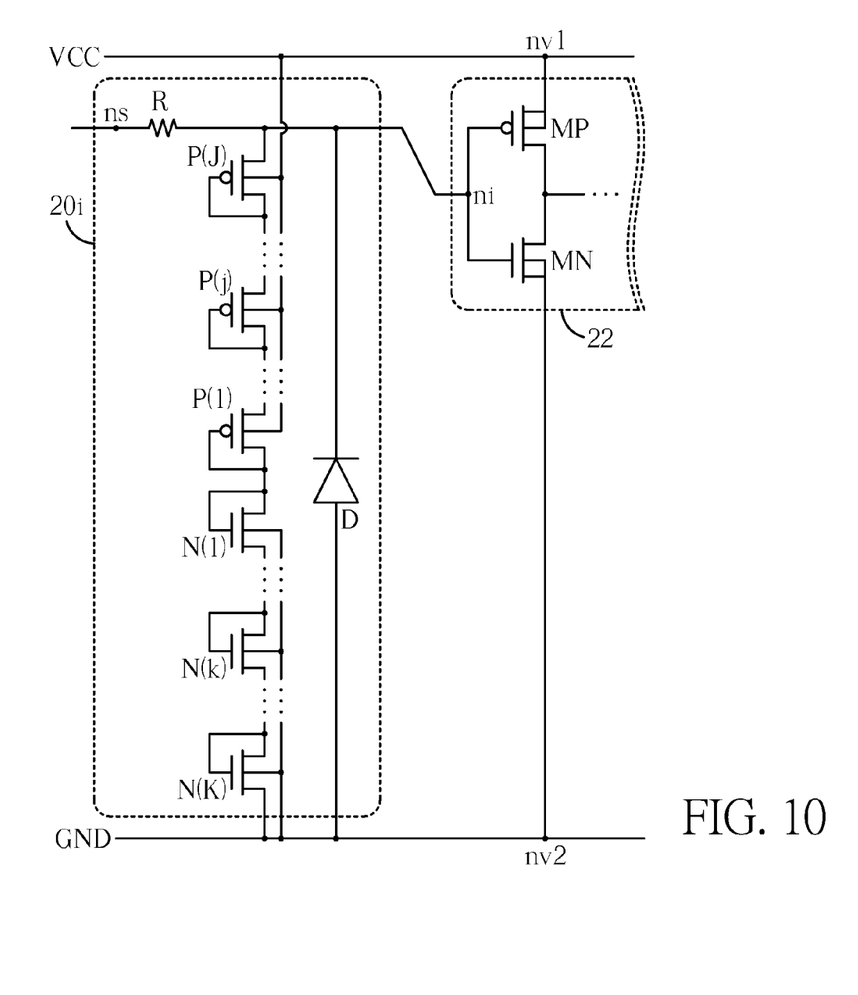

Please refer to FIG. 8 to FIG. 10 respectively illustrating ESD protection circuit 20g to 20i for protection an internal circuit 22 according to embodiments of the invention. The internal circuit 22 receives signal from signal routing of a node ns, and is coupled to DC voltages VCC and GND via supply routings of nodes nv1 and nv2; the nodes nv1 and nv2 are electrically isolated. The ESD protection circuits 20g, 20h and 20i all include a resistor R, transistors P(1), P(2), . . . , P(j) to P(J) and transistors N(1), . . . , N(k) to N(K). The resistor R is coupled between nodes ns and ni, the transistors P(1) to P(J) and N(1) to N(K) function as protection transistors serially coupled between the nodes ni and nv2; wherein the quantities J and K are constant integers, they can be the same of different. The transistors P(j) and N(k) are transistors of different kinds; the transistors P(1) to P(J) can be p-channel MOS transistors, and the transistors N(1) to N(K) can be n-channel MOS transistors. Each transistor P(j) (for j=1 to J) includes a gate, a source, a drain and a bulk; the gate is coupled to the drain, the drain and the source are respectively coupled between nodes na and ni. Each transistor N(k) (for k=1 to K) also includes a gate, a source, a drain and a bulk; the gate is coupled to the drain, the drain and the source are respectively coupled between the nodes na and nv2. If the quantity J is greater than 1, the drain of the first transistor P(1) among the transistors P(1) to P(J) is coupled to the node na, the source of the last transistor p(J) is coupled to the node ni; the drain of the transistor P(j) (for j greater than 1 and less than or equal to J) is coupled to the source of the preceding transistor P(j−1). If the quantity J equals 1, the drain and the source of the transistor P(1) are respectively coupled to the nodes na and ni.

If the quantity K is greater than 1, the drain of the first transistor N(1) among the transistors N(1) to N(K) is coupled to the drain of the transistor P(1) at the node na, the source of the last transistor N(K) is coupled to the node nv2; the drain of the transistor N(k) (for k greater than 1 and less than or equal to K) is coupled to the source of the preceding transistor N(k−1). The bulks of the transistors N(1) to N(K) are commonly coupled to the node nv2. If the quantity K equals 1, the drain and the source of the transistor N(1) are respectively coupled to the nodes na and nv2.

Similar to the ESD protection circuit 20a of FIG. 2, when ESD zaps between the nodes ns and nv2 with a positive voltage V_ESD at the node ns, the transistors P(1) to P(J) and N(1) to N(K) turn on with channel conduction, thus ESD current can be conducted from the nodes ni to nv2, the voltage at the node ni is then suppressed to protect gate-oxide of the internal circuit 22.

In the ESD protection circuit 20g of FIG. 8, the bulks of the transistors P(1) to P(J) are commonly coupled to the node ni, a parasitic diode Dsp is therefore formed between the nodes na and ni; similarly, the bulks of the transistors N(1) to N(K) are commonly coupled to the node nv2, and another parasitic diode Dsn is formed between the nodes nv2 and na. The diodes Dsp and Dsn are serially coupled between the nodes ni and nv2, an anode of the diode Dsp is coupled to a cathode of the diode Dsn; a cathode of the diode Dsp is coupled to the node ni and an anode of the diode Dsn is coupled to the node nv2. In the ESD protection circuit 20h of FIG. 9, each of the transistors P(1) to P(j) has its own bulk individually coupled to its source, thus the ESD protection circuit 20h can further include a diode D having an anode and a cathode respectively coupled to the nodes nv2 and ni. In the ESD protection circuit 20i of FIG. 10, the bulks of the transistors P(1) to P(J) are commonly coupled to the node nv1, and the ESD protection circuit 20i further includes a diode D with an anode and a cathode respectively coupled to the nodes nv2 and ni. When ESD hits between the nodes nv2 and ns with a positive voltage at the node nv2, the diodes Dsp and Dsn of the ESD protection circuit 20g and the diode D of the ESD protection circuits 20h and 20i achieve ESD protection of a forward-biased diode, such that ESD current of the node nv2 can be conducted to the node ni.

In the ESD protection circuit 20g of FIG. 8, the common bulk topology of the transistors P(1) to P(J) and N(1) to N(K) further forms a silicon controlled rectifier (SCR) of pnpn junctions between the nodes ni and nv2. When ESD occurs, this SCR will be triggered to enhance current conduction ability between the nodes ni and nv2 for the ESD protection circuit 20g.

To sum up, comparing to prior arts, ESD protection of the invention adopts topology of series transistors which effectively reduces trigger voltage for the ESD protection to start conducting, lowers capacitive loading on signal routings, and increases layout area usage efficiency. ESD protection of the invention also provides plenty of design parameters to tune the trigger voltage of the ESD protection circuit, leakage current, loading of signal routings and layout dimensions, also to provide circuit design flexibility and adaptability for different applications; for example, besides functioning as secondary protection circuit for input pad, the invention also applied to design of multiple power domains as protection circuit between different power domains.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electro-static discharge (ESD) protection circuit comprising:
   at least a protection transistor serially coupled between an internal node and a voltage node; each said protection transistor comprising a gate, a source and a drain with the gate being coupled to the drain; and
   a resistor coupled between the internal node and a signal node;
   wherein when an ESD event causes a voltage at the signal node to be greater than a voltage at the voltage node, each said protection transistor is arranged to conduct a current greater than a ratio equal to a voltage difference divided by a resistance of the resistor, with the voltage difference being between the voltage at the signal node and a tolerable voltage of the internal node.

2. The ESD protection circuit of claim 1, wherein each said protection transistor further comprises a bulk coupled to the voltage node.

3. The ESD protection circuit of claim 1, wherein each said protection transistor further comprises a bulk coupled to the source.

4. The ESD protection circuit of claim 1, wherein each said protection transistor further comprises a bulk coupled to a second voltage node, and the second voltage node is isolated from the voltage node.

5. The ESD protection circuit of claim 1 further comprising:
   at least a second protection transistor serially coupled between the internal node and the voltage node along with each said protection transistor; each said second protection transistor comprising a second source, a second gate and a second drain with the second gate being coupled to the second drain;
   wherein said protection transistor and said second protection transistor are of different types of channels.

6. The ESD protection circuit of claim 5, wherein the drain of a said protection transistor is coupled to the second drain of a said second protection transistor, such that each said protection transistor and each said second protection transistor are serially coupled between the internal node and the voltage node.

7. The ESD protection circuit of claim 1 further comprising at least a diode serially coupled between the internal node and the voltage node.

8. The ESD protection circuit of claim 1, wherein the internal node is arranged to couple at least an internal transistor, said internal transistor comprises an internal gate, and a gate-oxide thickness of the internal gate is less then a gate-oxide thickness of the gate of each said protection transistor.

* * * * *